(12) United States Patent
Enokizono et al.

(10) Patent No.: US 11,984,480 B2
(45) Date of Patent: May 14, 2024

(54) SILICON CARBIDE EPITAXIAL SUBSTRATE

(71) Applicant: SUMITOMO ELECTRIC INDUSTRIES, LTD., Osaka (JP)

(72) Inventors: Taro Enokizono, Osaka (JP); Tsutomu Hori, Osaka (JP); Taro Nishiguchi, Osaka (JP)

(73) Assignee: Sumitomo Electronic Industries, Ltd., Osaka (JP)

( * ) Notice: Subject to any disclaimer, the term of this patent is extended or adjusted under 35 U.S.C. 154(b) by 527 days.

(21) Appl. No.: 17/270,230

(22) PCT Filed: Jun. 2, 2020

(86) PCT No.: PCT/JP2020/021744
§ 371 (c)(1),
(2) Date: Feb. 22, 2021

(87) PCT Pub. No.: WO2020/255698
PCT Pub. Date: Dec. 24, 2020

(65) Prior Publication Data
US 2021/0328024 A1     Oct. 21, 2021

(30) Foreign Application Priority Data

Jun. 19, 2019 (JP) .................. 2019-113746

(51) Int. Cl.
*H01L 29/16* (2006.01)
*C30B 29/36* (2006.01)

(52) U.S. Cl.
CPC .......... *H01L 29/1608* (2013.01); *C30B 29/36* (2013.01)

(58) Field of Classification Search
CPC ..... H01L 29/1608; H01L 29/06; H01L 29/24; H01L 29/36; H01L 21/02002;
(Continued)

(56) References Cited

U.S. PATENT DOCUMENTS

2008/0035632 A1    2/2008  Fujita
2012/0193702 A1*   8/2012  Machida ........... H01L 29/66068
                                                                257/329
(Continued)

FOREIGN PATENT DOCUMENTS

JP    2005-1899 A    1/2005
JP    2006-60195 A   3/2006
(Continued)

*Primary Examiner* — Shaun M Campbell
(74) *Attorney, Agent, or Firm* — Renner, Otto, Boisselle & Sklar, LLP

(57) ABSTRACT

A silicon carbide epitaxial substrate includes a silicon carbide substrate, a first silicon carbide epitaxial layer, and a second silicon carbide epitaxial layer. The silicon carbide substrate has a first main surface and a second main surface opposite to the first main surface. The first silicon carbide epitaxial layer is in contact with a whole of the first main surface. The second silicon carbide epitaxial layer is in contact with a whole of the second main surface. A carrier concentration of the silicon carbide substrate is higher than a carrier concentration of each of the first silicon carbide epitaxial layer and the second silicon carbide epitaxial layer.

10 Claims, 15 Drawing Sheets

(58) Field of Classification Search
CPC ......... H01L 21/02024; H01L 21/02035; H01L 21/02378; H01L 21/02433; H01L 21/02529; H01L 21/0262; H01L 21/02658; H01L 22/12; C30B 29/36; C30B 25/12; C30B 25/20; C23C 16/42
See application file for complete search history.

(56) References Cited

U.S. PATENT DOCUMENTS

| | | | |
|---|---|---|---|
| 2013/0026497 A1* | 1/2013 | Inoue | H01L 21/02019 |
| | | | 257/77 |
| 2018/0033703 A1* | 2/2018 | Honke | H01L 21/304 |
| 2018/0226246 A1* | 8/2018 | Hamano | H01L 21/02529 |
| 2018/0363166 A1* | 12/2018 | Wada | C23C 16/325 |
| 2019/0013198 A1* | 1/2019 | Itoh | C23C 16/325 |
| 2020/0279922 A1* | 9/2020 | Sakai | H01L 21/02658 |

FOREIGN PATENT DOCUMENTS

| | | |
|---|---|---|
| JP | 2012-214376 A | 11/2012 |
| JP | 2015-207695 A | 11/2015 |
| WO | 2006/108191 A2 | 10/2006 |
| WO | 2016/059670 A1 | 4/2016 |

* cited by examiner

SILICON CARBIDE EPITAXIAL SUBSTRATE

TECHNICAL FIELD

The present disclosure relates to a silicon carbide epitaxial substrate. The present application claims a priority based on Japanese Patent Application No. 2019-113746 filed on Jun. 19, 2019, the entire content of which is incorporated herein by reference.

BACKGROUND ART

Japanese Patent Laying-Open No. 2012-214376 (PTL 1) describes a silicon carbide wafer having a TTV (total thickness variation) of about less than 2.0 μm.

CITATION LIST

Patent Literature

PTL 1: Japanese Patent Laying-Open No. 2012-214376

SUMMARY OF INVENTION

A silicon carbide epitaxial substrate according to the present disclosure includes a silicon carbide substrate, a first silicon carbide epitaxial layer, and a second silicon carbide epitaxial layer. The silicon carbide substrate has a first main surface and a second main surface opposite to the first main surface. The first silicon carbide epitaxial layer is in contact with a whole of the first main surface. The second silicon carbide epitaxial layer is in contact with a whole of the second main surface. A carrier concentration of the silicon carbide substrate is higher than a carrier concentration of each of the first silicon carbide epitaxial layer and the second silicon carbide epitaxial layer.

DETAILED DESCRIPTION

Figure 1:
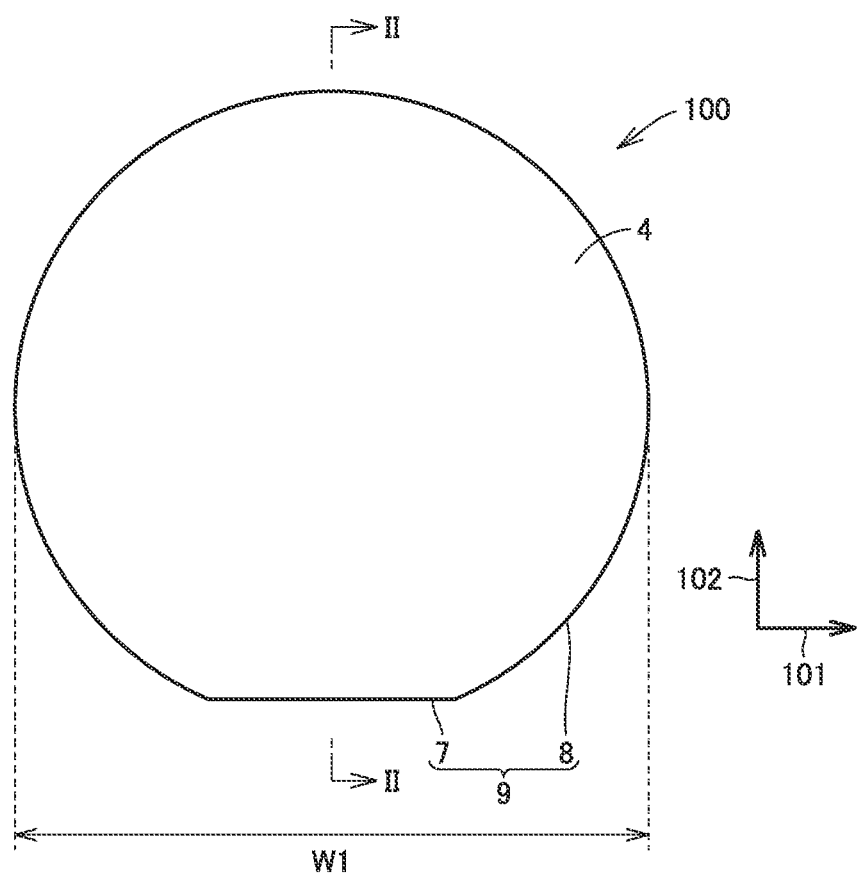
FIG. 1 is a schematic plan view showing a configuration of a silicon carbide epitaxial substrate according to a first embodiment.

Problems to be Solved by the Present Disclosure

An object of the present disclosure is to provide a silicon carbide epitaxial substrate allowing for suppression of occurrence of exposure failure.

Advantageous Effect of the Present Disclosure

According to the present disclosure, there can be provided a silicon carbide epitaxial substrate allowing for suppression of occurrence of exposure failure.

DESCRIPTION OF EMBODIMENTS

First, embodiments of the present disclosure are listed and described.

(1) A silicon carbide epitaxial substrate 100 according to the present disclosure includes a silicon carbide substrate 30, a first silicon carbide epitaxial layer 10, and a second silicon carbide epitaxial layer 20. Silicon carbide substrate 30 has a first main surface 1 and a second main surface 2 opposite to first main surface 1. First silicon carbide epitaxial layer 10 is in contact with a whole of first main surface 1. Second silicon carbide epitaxial layer 20 is in contact with a whole of second main surface 2. A carrier concentration of silicon carbide substrate 30 is higher than a carrier concentration of each of first silicon carbide epitaxial layer 10 and second silicon carbide epitaxial layer 20.

(2) In silicon carbide epitaxial substrate 100 according to (1), first silicon carbide epitaxial layer 10 may have a third main surface 3 in contact with first main surface 1 and a fourth main surface 4 opposite to third main surface 3. A maximum diameter of fourth main surface 4 may be more than or equal to 150 mm. When fourth main surface 4 is divided into a plurality of square regions 50 each having sides each having a length of 10 mm, a maximum local thickness variation of silicon carbide epitaxial substrate 100 may be less than or equal to 3 μm in the plurality of square regions 50.

(3) In silicon carbide epitaxial substrate 100 according to (1) or (2), a value obtained by dividing a standard deviation of a thickness of first silicon carbide epitaxial layer 10 by an average value of the thickness of first silicon carbide epitaxial layer 10 may be smaller than a value obtained by dividing a standard deviation of a thickness of second silicon carbide epitaxial layer 20 by an average value of the thickness of second silicon carbide epitaxial layer 20.

(4) In silicon carbide epitaxial substrate 100 according to (3), the value obtained by dividing the standard deviation of the thickness of first silicon carbide epitaxial layer 10 by the average value of the thickness of first silicon carbide epitaxial layer 10 may be less than or equal to 7%.

(5) In silicon carbide epitaxial substrate 100 according to (3), the value obtained by dividing the standard deviation of the thickness of second silicon carbide epitaxial layer 20 by the average value of the thickness of second silicon carbide epitaxial layer 20 may be more than or equal to 10%.

(6) In silicon carbide epitaxial substrate 100 according to any one of (1) to (5), a total thickness variation of silicon carbide epitaxial substrate 100 may be less than or equal to 8 μm.

DETAILS OF EMBODIMENTS OF THE PRESENT DISCLOSURE

Hereinafter, the embodiments of the present disclosure will be described in detail with reference to the figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative index is supposed to be crystallographically indicated by putting "-" (bar) above a numeral, but is indicated by putting the negative sign before the numeral in the present specification.

First Embodiment

Figure 2:
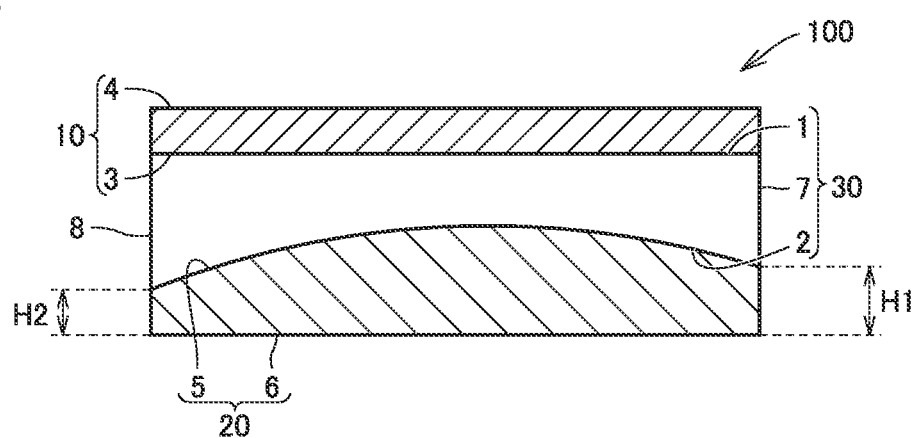
FIG. 2 is a schematic cross sectional view taken along a line II-II of FIG. 1.

First, a configuration of a silicon carbide epitaxial substrate 100 according to a first embodiment will be described. FIG. 1 is a schematic plan view showing the configuration of silicon carbide epitaxial substrate 100 according to the first embodiment. FIG. 2 is a schematic cross sectional view taken along a line II-II of FIG. 1.

As shown in FIG. 1, silicon carbide epitaxial substrate 100 according to the first embodiment has a fourth main surface 4 and an outer peripheral edge 9. Fourth main surface 4 expands along each of a first direction 101 and a second direction 102. First direction 101 is, for example, a <11-20> direction. Second direction 102 is, for example, a <1-100> direction. Fourth main surface 4 corresponds to a {0001} plane or a plane inclined with respect to the {0001} plane. Specifically, fourth main surface 4 corresponds to, for example, a (0001) plane or a plane inclined at an angle of less than or equal to 8° with respect to the (0001) plane. Fourth main surface 4 may correspond to a (000-1) plane or a plane inclined at an angle of less than or equal to 8° with respect to the (000-1) plane. When fourth main surface 4 is inclined with respect to the {0001} plane, the inclination direction (off direction) of fourth main surface 4 with respect to the {0001} plane is, for example, the <11-20> direction.

As shown in FIG. 1, outer peripheral edge 9 has an orientation flat portion 7 and an arc-shaped portion 8. Arc-shaped portion 8 is continuous to orientation flat portion 7. As shown in FIG. 1, orientation flat portion 7 extends along first direction 101 when viewed in a direction perpendicular to fourth main surface 4. The maximum diameter (diameter W1) of fourth main surface 4 is, for example, 150 mm. Diameter W1 may be 200 mm or 250 mm. The upper limit of diameter W1 is not particularly limited, but may be 300 mm, for example. That is, diameter W1 may be more than or equal to 150 mm and less than or equal to 300 mm. Diameter W1 represents the longest straight line distance between two different points on outer peripheral edge 9.

As shown in FIG. 2, silicon carbide epitaxial substrate 100 according to the first embodiment includes a silicon carbide substrate 30, a first silicon carbide epitaxial layer 10, and a second silicon carbide epitaxial layer 20. Silicon carbide substrate 30 has a first main surface 1, a second main surface 2, orientation flat portion 7, and arc-shaped portion 8. Second main surface 2 is a surface opposite to first main surface 1. Orientation flat portion 7 is continuous to each of first main surface 1 and second main surface 2. Similarly, arc-shaped portion 8 is continuous to each of first main surface 1 and second main surface 2. First silicon carbide epitaxial layer 10 is in contact with the whole of first main surface 1. Second silicon carbide epitaxial layer 20 is in contact with the whole of second main surface 2. Silicon carbide substrate 30 is interposed between first silicon carbide epitaxial layer 10 and second silicon carbide epitaxial layer 20.

Each of silicon carbide substrate 30, first silicon carbide epitaxial layer 10, and second silicon carbide epitaxial layer 20 is composed of, for example, a silicon carbide single crystal. Specifically, each of silicon carbide substrate 30, first silicon carbide epitaxial layer 10, and second silicon carbide epitaxial layer 20 may be composed of, for example, silicon carbide having a polytype of 4H. The thickness of silicon carbide substrate 30 is, for example, more than or equal to 350 μm and less than or equal to 500 μm.

Each of silicon carbide substrate 30, first silicon carbide epitaxial layer 10, and second silicon carbide epitaxial layer 20 includes carriers. Each of silicon carbide substrate 30, first silicon carbide epitaxial layer 10, and second silicon carbide epitaxial layer 20 includes, for example, nitrogen (N) as an n type impurity. The conductivity type of each of silicon carbide substrate 30, first silicon carbide epitaxial layer 10, and second silicon carbide epitaxial layer 20 is, for example, n type (first conductivity type).

FIG. 2 shows a cross section that perpendicularly bisects orientation flat portion 7 when viewed in the direction perpendicular to fourth main surface 4. As shown in FIG. 2, first silicon carbide epitaxial layer 10 has a third main surface 3 and a fourth main surface 4. Third main surface 3 is in contact with the whole of first main surface 1. Fourth main surface 4 is a surface opposite to third main surface 3. Similarly, second silicon carbide epitaxial layer 20 has a fifth main surface 5 and a sixth main surface 6. Fifth main surface 5 is in contact with the whole of second main surface 2. Sixth main surface 6 is a surface opposite to fifth main surface 5.

Next, the following describes a method for measuring the thickness of each of first silicon carbide epitaxial layer 10 and second silicon carbide epitaxial layer 20.

The thickness of each of first silicon carbide epitaxial layer 10 and second silicon carbide epitaxial layer 20 can be measured using, for example, an FTIR (Fourier Transform InfraRed spectrometer). Examples of the measurement apparatus include a Fourier transform infrared spectrophotometer (IRPrestige-21) manufactured by Shimadzu Corporation. The thickness of each silicon carbide epitaxial layer measured by the FTIR is determined using an optical constant difference caused by a carrier concentration difference between the silicon carbide epitaxial layer and silicon carbide substrate 30. A measurement wave number range is, for example, a range from 3400 $cm^{-1}$ to 2400 $cm^{-1}$. A wave number interval is, for example, about 4 $cm^{-1}$.

Specifically, the thickness of first silicon carbide epitaxial layer 10 is measured by emitting infrared light thereto and measuring an interference between reflected light from fourth main surface 4 of first silicon carbide epitaxial layer 10 and reflected light from an interface between first silicon carbide epitaxial layer 10 and silicon carbide substrate 30. Similarly, the thickness of second silicon carbide epitaxial layer 20 is measured by emitting infrared light thereto and measuring an interference between reflected light from sixth main surface 6 of second silicon carbide epitaxial layer 20 and reflected light from an interface between second silicon carbide epitaxial layer 20 and silicon carbide substrate 30.

Next, the following describes a method for measuring a carrier concentration of each of first silicon carbide epitaxial layer 10 and second silicon carbide epitaxial layer 20.

The carrier concentration of each of first silicon carbide epitaxial layer 10 and second silicon carbide epitaxial layer 20 is measured by, for example, a mercury probe type C (capacitance)-V (voltage) measurement apparatus. Specifically, one probe is placed on the fourth main surface 4 side of first silicon carbide epitaxial layer 10 and the other probe is placed on the third main surface 3 side of first silicon carbide epitaxial layer 10. Similarly, one probe is placed on the sixth main surface 6 side of second silicon carbide epitaxial layer 20 and the other probe is placed on the fifth main surface 5 side of second silicon carbide epitaxial layer 20. The area of the one probe is, for example, 0.01 cm². A voltage is applied between the one probe and the other probe and a capacitance between the one probe and the other probe is measured. The carrier concentration is determined based on the inclination of a straight line of measurement data with the vertical axis representing $1/C^2$ (reciprocal of the square of the capacitance) and the horizontal axis representing V (voltage). A measurement voltage range is, for example, a range from −5 V to 0 V.

Figure 3:
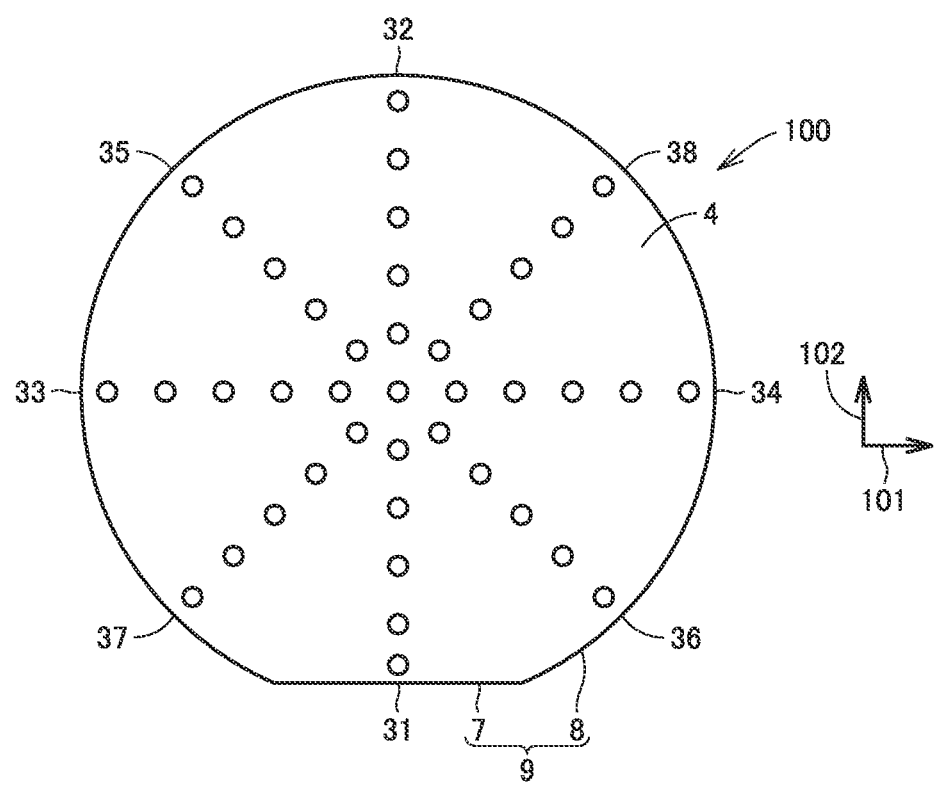
FIG. 3 is a schematic plan view showing measurement positions for thickness and carrier concentration of each silicon carbide epitaxial layer.

FIG. 3 is a schematic plan view showing measurement positions for the thickness and carrier concentration of each silicon carbide epitaxial layer. In FIG. 3, portions indicated by white circles represent the measurement positions for the thickness and carrier concentration of the silicon carbide epitaxial layer. Specifically, as shown in FIG. 3, the thickness and carrier concentration of the silicon carbide epitaxial layer are measured along a first straight line extending through a first position 31 (OF) and a second position 32 (COF), a second straight line extending through a third position 33 (IF) and a fourth position 34 (CIF), a third straight line extending through a fifth position 35 and a sixth position 36, and a fourth straight line extending through a seventh position 37 and an eighth position 38. The first straight line is parallel to the second direction. The second straight line is parallel to the first direction. The third straight line is inclined at 450 with respect to each of the first straight line and the second straight line. The fourth straight line is orthogonal to the third straight line. Intervals between the measurement positions are substantially equal. The number of the measurement positions is, for example, 41. It should be noted that only the measurement position closest to first position 31 is located on the second position 32 side with respect to orientation flat portion 7 so as not to overlap with orientation flat portion 7. By determining the measurement positions in this way, a distribution in each of the thickness and carrier concentration of the silicon carbide epitaxial layer in an in-plane direction of fourth main surface 4 can be measured.

The carrier concentration of silicon carbide substrate 30 is higher than the carrier concentration of each of first silicon carbide epitaxial layer 10 and second silicon carbide epitaxial layer 20. Each of the carrier concentration of silicon carbide substrate 30 and the carrier concentration of each of first silicon carbide epitaxial layer 10 and second silicon carbide epitaxial layer 20 is, for example, an average of carrier concentrations at the 41 positions in the plane. The carrier concentration of silicon carbide substrate 30 is, for example, more than or equal to $1 \times 10^{18}$ cm$^{-3}$ and less than or equal to $1 \times 10^{20}$ cm$^{-3}$. The carrier concentration of each of first silicon carbide epitaxial layer 10 and second silicon carbide epitaxial layer 20 is, for example, more than or equal to $1 \times 10^{15}$ cm$^{-3}$ and less than or equal to $1 \times 10^{17}$ cm$^{-3}$. The carrier concentration of first silicon carbide epitaxial layer 10 is substantially the same as the carrier concentration of second silicon carbide epitaxial layer 20.

As shown in FIG. 2, the thickness (first thickness H1) of second silicon carbide epitaxial layer 20 at first position 31 (see FIG. 3) in orientation flat portion 7 may be larger than the thickness (second thickness H2) of second silicon carbide epitaxial layer 20 at second position 32 (see FIG. 3) in arc-shaped portion 8. Fifth main surface 5 may be curved to protrude toward first main surface 1. Sixth main surface 6 is substantially flat. Second silicon carbide epitaxial layer 20 may have a portion having a thickness that is monotonously increased from first position 31 toward second position 32. Similarly, second silicon carbide epitaxial layer 20 may have a portion having a thickness that is monotonously increased from second position 32 toward first position 31. That is, second silicon carbide epitaxial layer 20 may have a maximum value of thickness at a position between first position 31 and second position 32.

As shown in FIG. 2, a variation in thickness of first silicon carbide epitaxial layer 10 is smaller than a variation in thickness of second silicon carbide epitaxial layer 20. Specifically, a value obtained by dividing the standard deviation of the thickness of first silicon carbide epitaxial layer 10 by the average value of the thickness of first silicon carbide epitaxial layer 10 may be smaller than a value obtained by dividing the standard deviation of the thickness of second silicon carbide epitaxial layer 20 by the average value of the thickness of second silicon carbide epitaxial layer 20. The standard deviation of the thickness of first silicon carbide epitaxial layer 10 is, for example, a standard deviation thereof at the 41 positions in the plane. The average value of the thickness of first silicon carbide epitaxial layer 10 is, for example, an average value thereof at the 41 positions in the plane.

The value (first ratio) obtained by dividing the standard deviation of the thickness of first silicon carbide epitaxial layer 10 by the average value of the thickness of first silicon carbide epitaxial layer 10 may be, for example, less than or equal to 7%. The first ratio may be less than or equal to 5% or may be less than or equal to 3%, for example. The lower limit of the first ratio is not particularly limited but may be more than or equal to 1%, for example.

The value (second ratio) obtained by dividing the standard deviation of the thickness of second silicon carbide epitaxial layer 20 by the average value of the thickness of second silicon carbide epitaxial layer 20 may be, for example, more than or equal to 10%. The second ratio may be more than or equal to 15% or may be more than or equal to 20%, for example. The upper limit of the second ratio is not particularly limited but may be less than or equal to 50%, for example.

Figure 4:
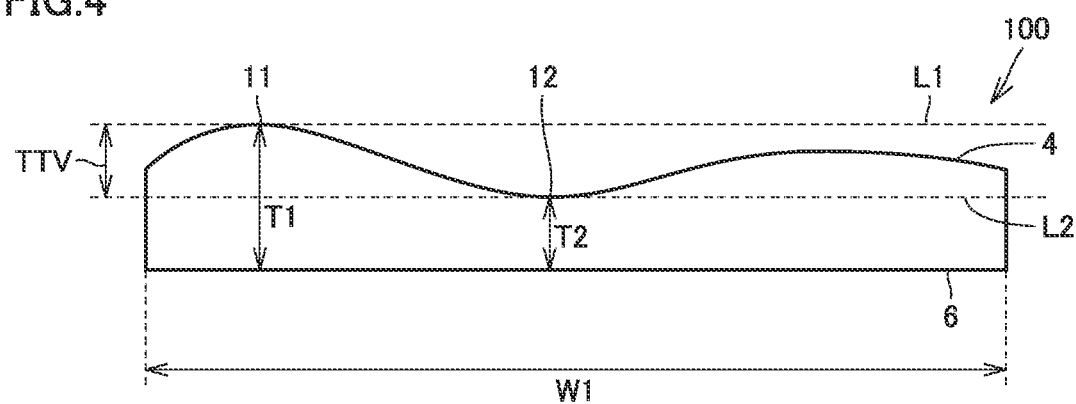
FIG. 4 is a schematic cross sectional view showing the definition of a TTV.

Next, a total thickness variation (TTV) will be described. FIG. 4 is a schematic cross sectional view showing the definition of the TTV.

$$TTV=|T1-T2| \qquad \text{(Formula 1)}$$

The TTV is measured in the following procedure, for example. First, the whole of sixth main surface 6 of silicon carbide epitaxial substrate 100 is suctioned onto a flat suction surface. Next, an image of the whole of fourth main surface 4 is optically obtained. As shown in FIG. 4 and indicated in Formula 1, the TTV represents a value obtained by subtracting, from the height (first height T1) from sixth main surface 6 to the maximum height point (first maximum height point 11) of fourth main surface 4, the height (second height T2) from sixth main surface 6 to the minimum height point (first minimum height point 12) of fourth main surface 4 with the whole of sixth main surface 6 being suctioned onto the flat suction surface. In other words, the TTV represents a value obtained by subtracting the shortest distance between sixth main surface 6 and fourth main surface 4 from the longest distance between sixth main surface 6 and fourth main surface 4 in the direction perpendicular to sixth main surface 6. That is, the TTV represents a distance between a plane (first plane L1) extending through first maximum height point 11 and parallel to sixth main surface 6 and a plane (second plane L2) extending through first minimum height point 12 and parallel to sixth main surface 6.

The TTV of silicon carbide epitaxial substrate 100 according to the present embodiment is, for example, less than or equal to 8 μm. The TTV may be less than or equal to 5 μm or may be less than or equal to 3 μm, for example. The lower limit of the TTV is not particularly limited but may be more than or equal to 1 μm, for example.

Figure 5:
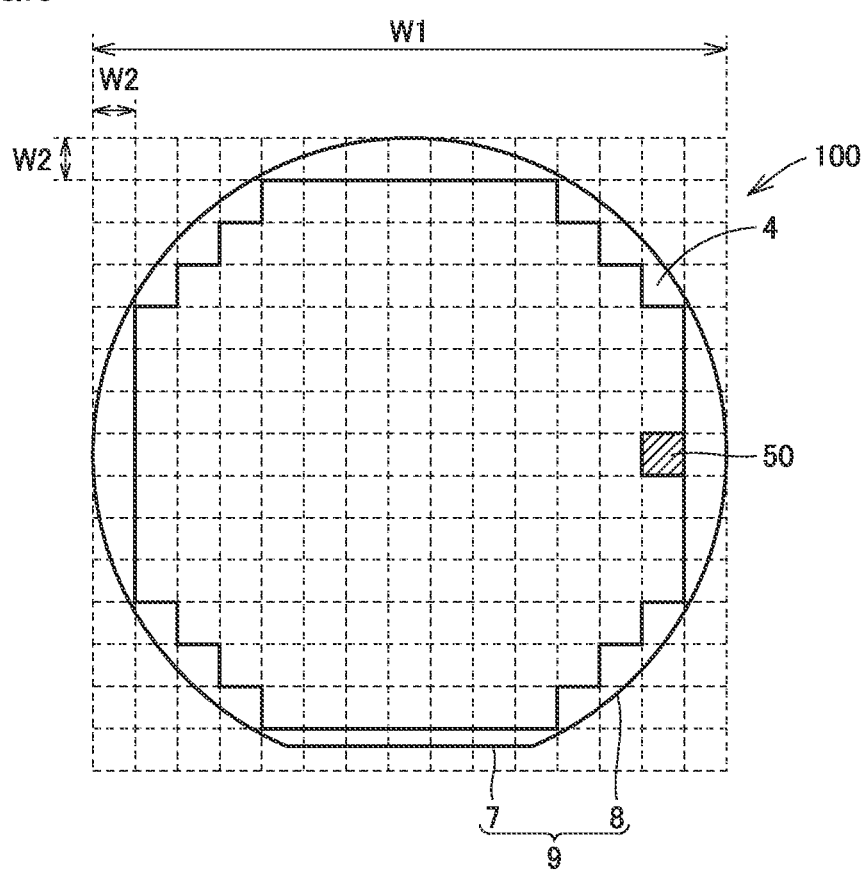
FIG. 5 is a schematic plan view showing a measurement region for a LTV.
Figure 6:
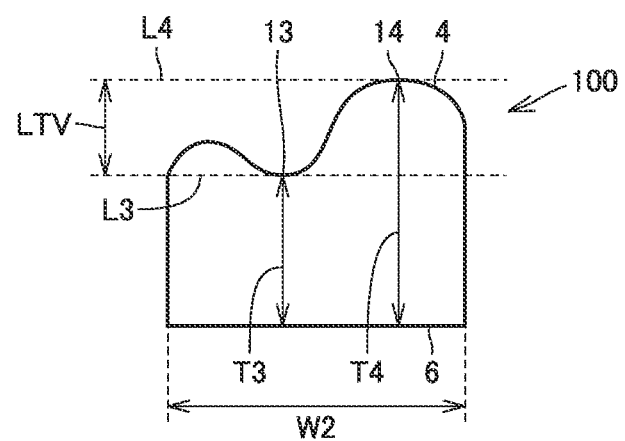
FIG. 6 is a schematic cross sectional view showing the definition of the LTV.

Next, a local thickness variation (LTV) will be described. FIG. 5 is a schematic plan view showing a measurement region for the LTV. FIG. 6 is a schematic cross sectional view showing the definition of the LTV.

As shown in FIG. 5, fourth main surface 4 can be divided into a plurality of square regions 50 each having sides each having a length W2 of 10 mm. Specifically, for example, a 150 mm×150 mm square circumscribing fourth main surface 4 is assumed. The 150 mm×150 mm square is divided into 10 mm×10 mm square regions 50 (15×15=225). Of the 225 square regions 50, a region surrounded by outer peripheral edge 9 and not in contact with outer peripheral edge 9 (region surrounded by a thick line in FIG. 5) is the measurement region for the LTV. One side of square region 50 is parallel to the extending direction of orientation flat portion 7.

$$LTV = |T4 - T3|$$ (Formula 2)

The LTV is measured in the following procedure, for example. First, the whole of sixth main surface 6 of silicon carbide epitaxial substrate 100 is suctioned onto a flat suction surface. Next, an image of each square region 50 is optically obtained. As shown in FIG. 6 and indicated in Formula 2, the LTV represents a value obtained by subtracting, from the height (fourth height T4) from sixth main surface 6 to the maximum height point (second maximum height point 14) of fourth main surface 4, the height (third height T3) from sixth main surface 6 to the minimum height point (second minimum height point 13) of fourth main surface 4 with the whole of sixth main surface 6 being suctioned onto the flat suction surface. In other words, the LTV represents a value obtained by subtracting the shortest distance between sixth main surface 6 and fourth main surface 4 from the longest distance between sixth main surface 6 and fourth main surface 4 in the direction perpendicular to sixth main surface 6. That is, the LTV represents a distance between a plane (fourth plane L4) extending through second maximum height point 14 and parallel to sixth main surface 6 and a plane (third plane L3) extending through second minimum height point 13 and parallel to sixth main surface 6.

As shown in FIG. 5, when the diameter of fourth main surface 4 is 150 mm, fourth main surface 4 can be divided into 145 square regions 50 each having sides each having a length W2 of 10 mm. The LTV of each of 145 square regions 50 is measured and the maximum LTV among them is determined. When fourth main surface 4 of silicon carbide epitaxial substrate 100 according to the present embodiment is divided into the plurality of (more specifically, 145) square regions 50 each having sides each having a length of 10 mm, the maximum LTV of the LTVs of the plurality of square regions 50 is, for example, less than or equal to 3 μm. In other words, each of the LTVs of all the square regions 50 is less than or equal to 3 sm. The maximum LTV of the LTVs of the plurality of square regions 50 may be less than or equal to 2 μm or may be less than or equal to 1 μm, for example. The lower limit of the maximum LTV of the LTVs of the plurality of square regions 50 is not particularly limited but may be more than or equal to 0.5 μm, for example.

It should be noted that each of the TTV and the LTV can be measured by using "Tropel FlatMaster (registered trademark)" manufactured by Corning Tropel, for example.

The surface roughness of fourth main surface 4 of silicon carbide epitaxial substrate 100 is, for example, less than or equal to 0.5 nm. Similarly, the surface roughness of sixth main surface 6 is, for example, less than or equal to 0.5 nm. Each surface roughness is a root mean square roughness Rq (RMS). The surface roughness can be measured using, for example, an AFM (Atomic Force Microscope). No scratch having a length of more than or equal to 30 μm in the in-plane direction may exist in fourth main surface 4. Similarly, no scratch having a length of more than or equal to 30 μm in the in-plane direction exists in sixth main surface 6. In other words, a scratch may exist in each of fourth main surface 4 and sixth main surface 6, but the maximum value of the length of the scratch is less than 30 μm.

Second Embodiment

Next, a configuration of a silicon carbide epitaxial substrate 100 according to a second embodiment will be described. Silicon carbide epitaxial substrate 100 according to the second embodiment is different from silicon carbide epitaxial substrate 100 according to the first embodiment in terms of a configuration in which the thickness of second silicon carbide epitaxial layer 20 is monotonously changed. The other configurations are the same as those of silicon carbide epitaxial substrate 100 according to the first embodiment. Hereinafter, the configuration different from that of silicon carbide epitaxial substrate 100 according to the first embodiment will be mainly described.

Figure 7:
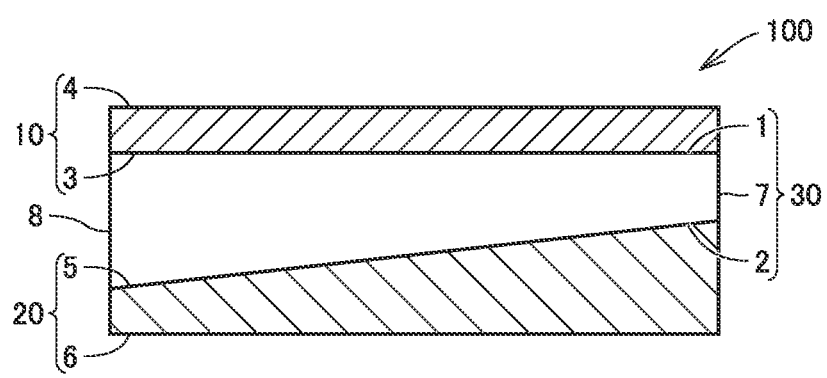
FIG. 7 is a schematic cross sectional view showing a configuration of a silicon carbide epitaxial substrate according to a second embodiment.

FIG. 7 is a schematic cross sectional view showing the configuration of silicon carbide epitaxial substrate 100 according to the second embodiment. As shown in FIG. 7, the thickness of second silicon carbide epitaxial layer 20 may be changed monotonously in the direction parallel to fourth main surface 4. Specifically, the thickness of second silicon carbide epitaxial layer 20 may be monotonously decreased from first position 31 (see FIG. 3) in orientation flat portion 7 toward second position 32 (see FIG. 3) in the arc-shaped portion. From a different point of view, it can be said that the thickness of silicon carbide substrate 30 may be monotonously increased from first position 31 (see FIG. 3)

in orientation flat portion 7 toward second position 32 (see FIG. 3) in the arc-shaped portion.

(Method for Manufacturing Silicon Carbide Epitaxial Substrate)

Figure 8:
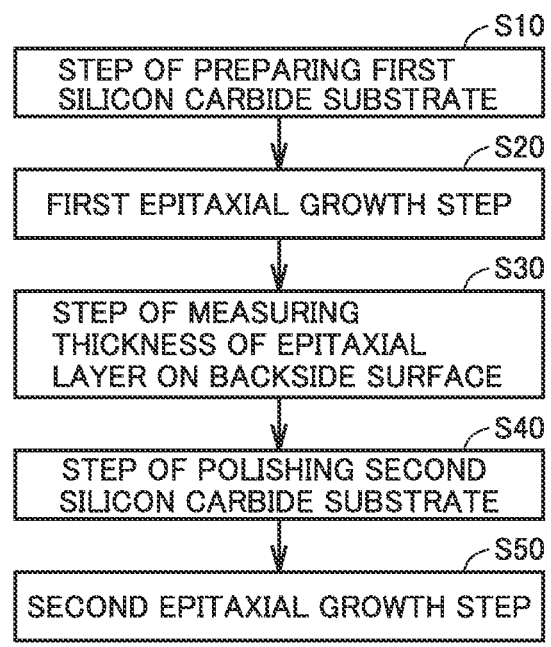
FIG. 8 is a flowchart schematically showing a method for manufacturing the silicon carbide epitaxial substrate according to the present embodiment.

Next, a method for manufacturing silicon carbide epitaxial substrate 100 according to the present embodiment will be described. FIG. 8 is a flowchart schematically showing the method for manufacturing silicon carbide epitaxial substrate 100 according to the present embodiment.

First, a step (S10: FIG. 8) of preparing a first silicon carbide substrate is performed. For example, an ingot composed of a silicon carbide single crystal produced by a sublimation method is sliced by a wire saw to prepare a first silicon carbide substrate 30. First silicon carbide substrate 30 is composed of, for example, silicon carbide having a polytype of 4H. First silicon carbide substrate 30 has first main surface 1 and second main surface 2 opposite to first main surface 1. First main surface 1 and second main surface 2 are ground and are then subjected to mechanical polishing and CMP (Chemical Mechanical Polishing).

Figure 9:
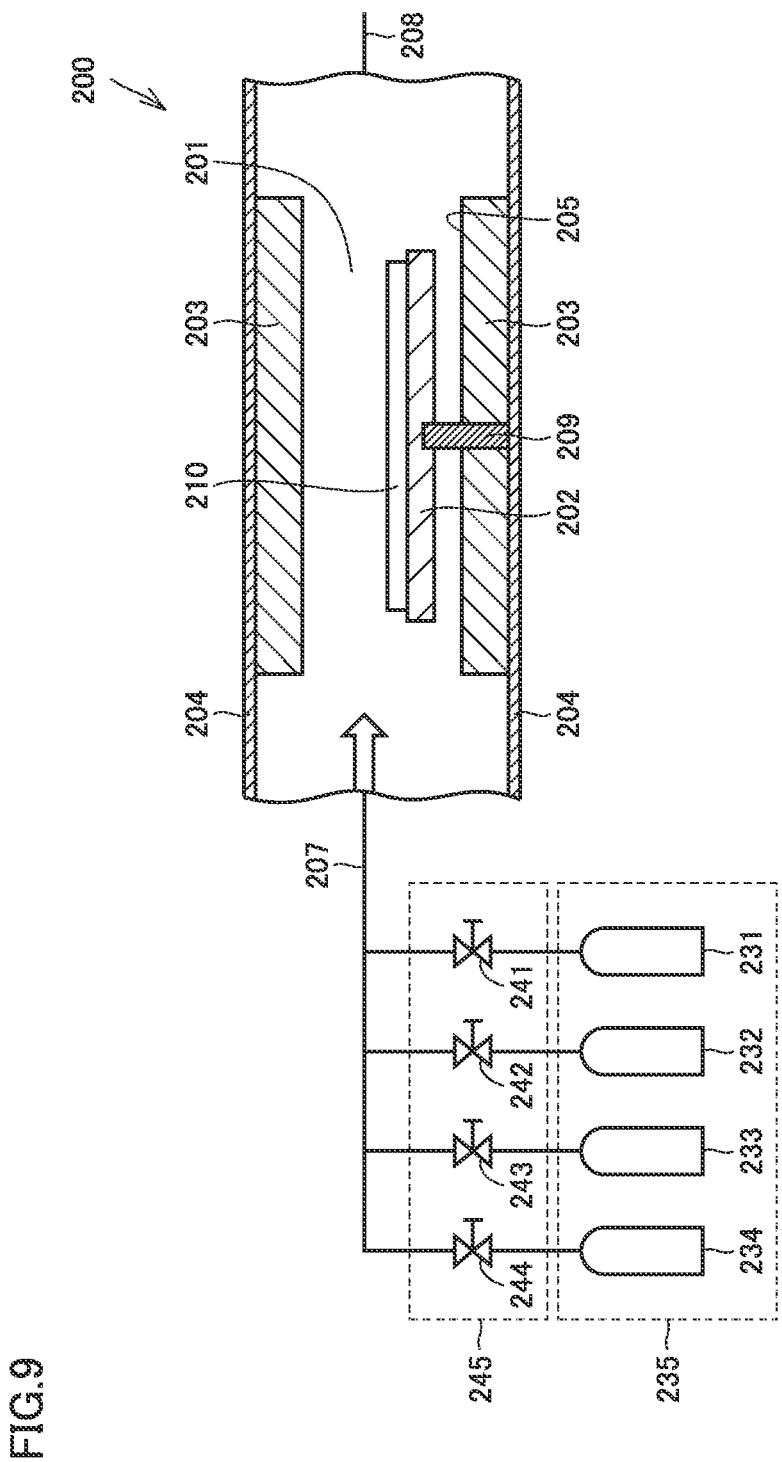
FIG. 9 is a schematic cross sectional view showing a configuration of a manufacturing apparatus for the silicon carbide epitaxial substrate according to the present embodiment.

Next, a first epitaxial growth step (S20: FIG. 8) is performed. Specifically, a hot wall type lateral CVD (Chemical Vapor Deposition) apparatus is prepared as a manufacturing apparatus 200 for silicon carbide epitaxial substrate 100. FIG. 9 is a schematic cross sectional view showing a configuration of manufacturing apparatus 200 for silicon carbide epitaxial substrate 100 according to the present embodiment. As shown in FIG. 9, manufacturing apparatus 200 for silicon carbide epitaxial substrate 100 mainly includes a reaction chamber 201, a gas supply unit 235, a control unit 245, a heating element 203, a quartz tube 204, a heat insulating material (not shown), and an induction heating coil (not shown).

Heating element 203 has, for example, a cylindrical shape and has reaction chamber 201 formed therein. Heating element 203 is composed of, for example, graphite. Heating element 203 is provided inside quartz tube 204. The heat insulating material surrounds the outer periphery of heating element 203. The induction heating coil is wound around and along the outer peripheral surface of quartz tube 204, for example. The induction heating coil can be supplied with alternating current by an external power supply (not shown). Thus, heating element 203 is inductively heated. As a result, reaction chamber 201 is heated by heating element 203.

Reaction chamber 201 is a space surrounded by an inner wall surface 205 of heating element 203. A susceptor 210 for holding silicon carbide substrate 30 is provided in reaction chamber 201. Susceptor 210 is composed of silicon carbide. Silicon carbide substrate 30 is placed on susceptor 210. Susceptor 210 is disposed on a stage 202. Stage 202 is rotatably supported by a rotation shaft 209. With rotation of stage 202, susceptor 210 is rotated.

Manufacturing apparatus 200 for silicon carbide epitaxial substrate 100 further includes a gas inlet 207 and a gas outlet 208. Gas outlet 208 is connected to a gas discharging pump (not shown). An arrow in FIG. 9 indicates a flow of gas. The gas is introduced from gas inlet 207 into reaction chamber 201, and is discharged from gas outlet 208. A pressure in reaction chamber 201 is adjusted by a balance between an amount of supply of the gas and an amount of discharging of the gas.

Gas supply unit 235 is configured to supply reaction chamber 201 with mixed gas including source material gas, dopant gas, and carrier gas. Specifically, gas supply unit 235 includes a first gas supply unit 231, a second gas supply unit 232, a third gas supply unit 233, and a fourth gas supply unit 234, for example.

First gas supply unit 231 is configured to supply first gas including carbon atoms, for example. First gas supply unit 231 is, for example, a gas cylinder having the first gas provided therein. The first gas is, for example, propane ($C_3H_8$) gas. The first gas may be, for example, methane ($CH_4$) gas, ethane ($C_2H_6$) gas, acetylene ($C_2H_2$) gas, or the like.

Second gas supply unit 232 is configured to supply second gas including silane gas, for example. Second gas supply unit 232 is, for example, a gas cylinder having the second gas provided therein. The second gas is, for example, silane ($SiH_4$) gas. The second gas may be mixed gas of silane gas and gas other than silane.

Third gas supply unit 233 is configured to supply third gas including ammonia gas, for example. Third gas supply unit 233 is, for example, a gas cylinder having the third gas provided therein. The third gas is doping gas including N (nitrogen atoms). Ammonia gas is more likely to be thermally decomposed than nitrogen gas having a triple bond.

Fourth gas supply unit 234 is configured to supply fourth gas (carrier gas) such as hydrogen. Fourth gas supply unit 234 is, for example, a gas cylinder having hydrogen provided therein.

Control unit 245 is configured to control a flow rate of the mixed gas supplied from gas supply unit 235 to reaction chamber 201. Specifically, control unit 245 may include a first gas flow rate control unit 241, a second gas flow rate control unit 242, a third gas flow rate control unit 243, and a fourth gas flow rate control unit 244. Each control unit may be, for example, an MFC (Mass Flow Controller). Control unit 245 is disposed between gas supply unit 235 and gas inlet 207. In other words, control unit 245 is disposed in a flow path that connects gas supply unit 235 to gas inlet 207.

Figure 10:
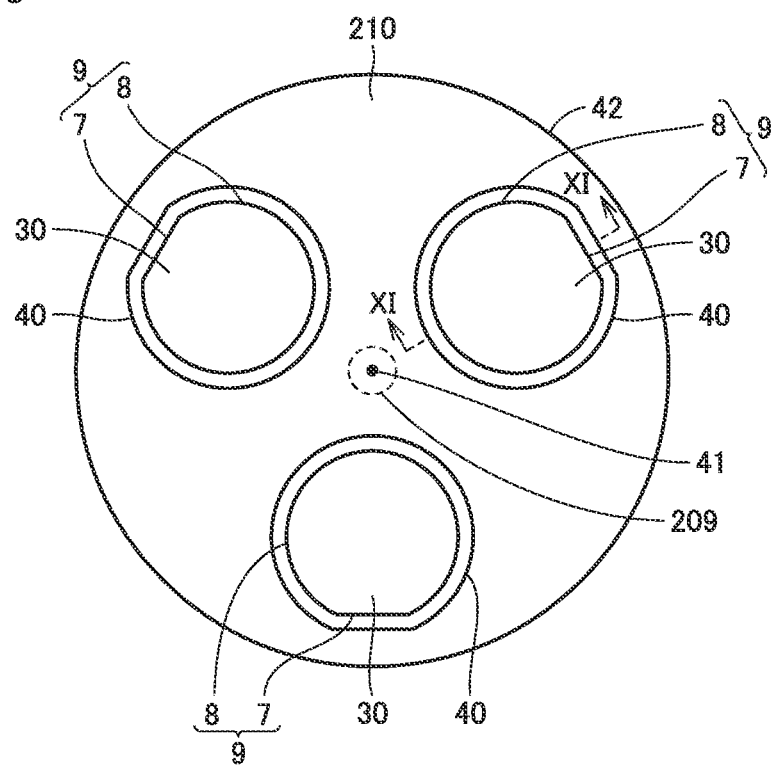
FIG. 10 is a schematic plan view showing a state in which a silicon carbide substrate is placed on a susceptor.

First, silicon carbide substrate 30 is placed on susceptor 210. FIG. 10 is a schematic plan view showing a state in which silicon carbide substrate 30 is placed on susceptor 210. As shown in FIG. 10, susceptor 210 has a substantially circular shape when viewed in a plan view. Three substrate placement grooves 40 are formed in susceptor 210. When viewed in a plan view, substrate placement grooves 40 are provided at an interval of 120°. Silicon carbide substrate 30 is placed in a substrate placement groove 40 such that the extension direction of orientation flat portion 7 of silicon carbide substrate 30 is perpendicular to the radial direction of susceptor 210.

Figure 11:
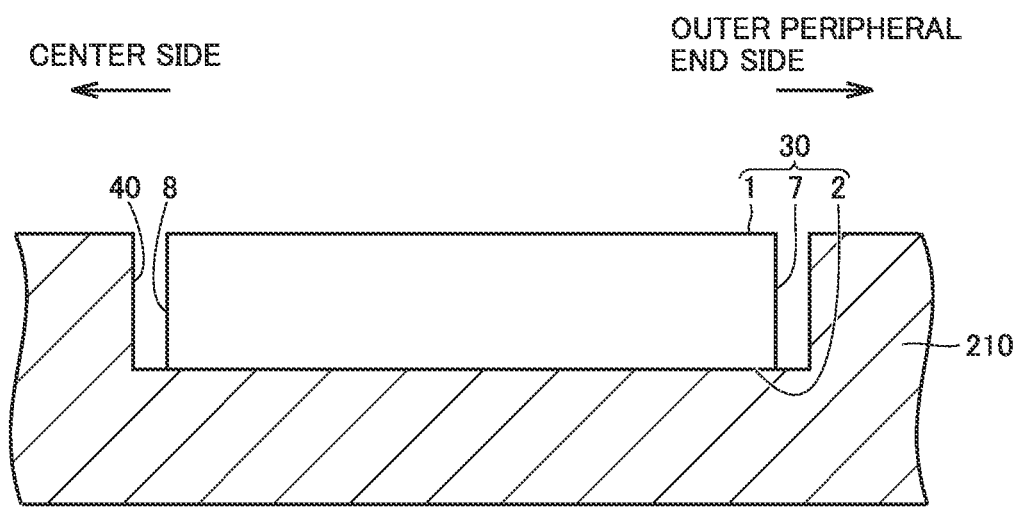
FIG. 11 is a schematic cross sectional view taken along XI-XI of FIG. 10.

FIG. 11 is a schematic cross sectional view taken along XI-XI of FIG. 10. As shown in FIG. 11, orientation flat portion 7 of silicon carbide substrate 30 is disposed on the outer peripheral end 42 side of susceptor 210. Arc-shaped portion 8 of silicon carbide substrate 30 opposite to orientation flat portion 7 is disposed on the center 41 side of susceptor 210.

Figure 12:
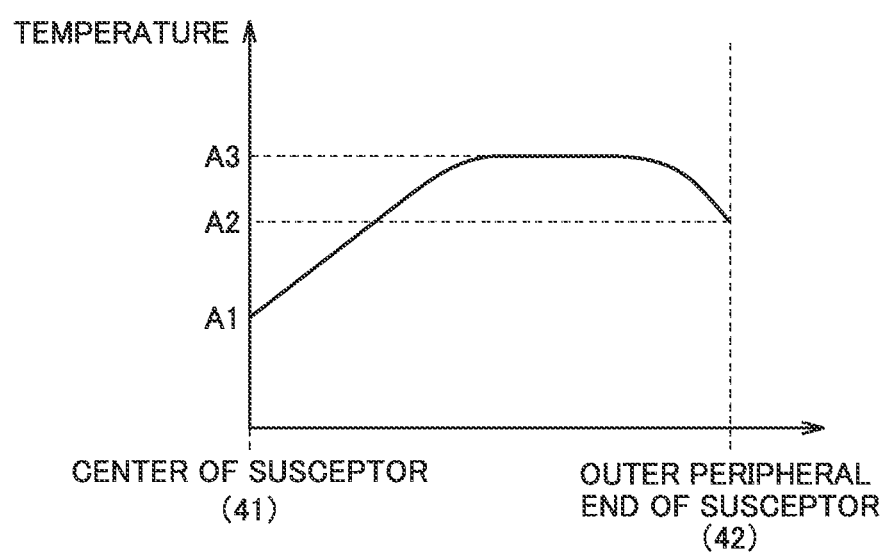
FIG. 12 is a diagram schematically showing an exemplary temperature distribution of the susceptor in a radial direction.

FIG. 12 is a diagram schematically showing an exemplary temperature distribution of susceptor 210 in the radial direction. As shown in FIG. 12, in a temperature distribution in the in-plane direction of susceptor 210, the temperature at center 41 of susceptor 210 is the lowest. The temperature at center 41 of susceptor 210 is a first temperature A1. As shown in FIG. 12, the temperature of susceptor 210 is increased monotonously from center 41 of susceptor 210 to a position between center 41 and outer peripheral end 42 in the radial direction. The maximum temperature of susceptor 210 is, for example, a third temperature A3. The temperature of susceptor 210 is monotonously decreased from the position indicating third temperature A3 toward the outer peripheral end 42 side. The temperature of outer peripheral end 42 of susceptor 210 is a second temperature A2. Second temperature A2 is higher than first temperature A1 and lower than third temperature A3. It is considered that heat is removed from center 41 of susceptor 210 through rotation shaft 209 and the temperature at center 41 of susceptor 210 is therefore lower than those of the other regions of susceptor 210. Outer peripheral end 42 of susceptor 210 is cooled by the gas introduced into reaction chamber 201.

Next, the pressure in reaction chamber 201 is decreased. Specifically, the pressure in reaction chamber 201 is decreased from the atmospheric pressure to, for example, about $1\times10^{-6}$ Pa, and then the temperature of silicon carbide substrate 30 starts to be increased. During the increase of the temperature, hydrogen ($H_2$) gas serving as the carrier gas is introduced from fourth gas supply unit 234 into reaction chamber 201.

After the temperature of reaction chamber 201 reaches a certain temperature, the source material gas, the dopant gas, and the carrier gas are supplied to reaction chamber 201. Specifically, for example, mixed gas including silane, propane, ammonia, and hydrogen is introduced into reaction chamber 201. In reaction chamber 201, each gas is thermally decomposed. A growth temperature is, for example, more than or equal to 1550° C. and less than or equal to 1750° C.

The flow rates of silane and propane are adjusted such that the C/Si ratio of the mixed gas is, for example, about more than or equal to 0.8 and less than or equal to 2.2. The pressure in reaction chamber 201 is, for example, 6 kPa. The flow rate of the fourth gas (hydrogen gas) supplied to reaction chamber 201 may be, for example, more than or equal to 100 slm and less than or equal to 150 slm.

Figure 13:
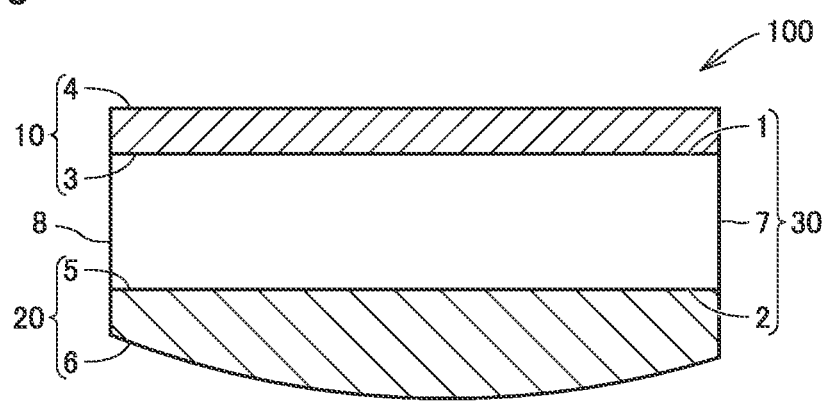
FIG. 13 is a schematic cross sectional view showing a step of forming a first silicon carbide epitaxial layer and a second silicon carbide epitaxial layer.

As shown in FIG. 13, first silicon carbide epitaxial layer 10 is formed on first main surface 1 of silicon carbide substrate 30. Similarly, second silicon carbide epitaxial layer 20 is formed on second main surface 2 of silicon carbide substrate 30. Second silicon carbide epitaxial layer 20 is formed in such a manner that a portion of susceptor 210 composed of silicon carbide sublimates to be deposited on second main surface 2 of silicon carbide substrate 30. A larger amount of silicon carbide sublimates at a portion of susceptor 210 with a high temperature than that at a portion of susceptor 210 with a low temperature. As a result, the thickness of second silicon carbide epitaxial layer 20 at the portion of second main surface 2 in contact with the portion of susceptor 210 with the high temperature is larger than the thickness of second silicon carbide epitaxial layer 20 at the portion of second main surface 2 in contact with the portion of susceptor 210 with the low temperature. That is, an in-plane distribution of the thickness of second silicon carbide epitaxial layer 20 substantially reflects the temperature distribution of susceptor 210.

Next, a step of measuring the thickness of the epitaxial layer on the backside surface (S30: FIG. 8) is performed. Specifically, the in-plane distribution of the thickness of second silicon carbide epitaxial layer 20 is measured by an FTIR. The measurement method and measurement positions for the thickness of second silicon carbide epitaxial layer 20 are as described above (see FIG. 3).

Next, a step of polishing a second silicon carbide substrate (S40: FIG. 8) is performed. For example, an ingot composed of a silicon carbide single crystal produced by a sublimation method is sliced by a wire saw to prepare a second silicon carbide substrate 30. Second silicon carbide substrate 30 is composed of, for example, silicon carbide having a polytype of 4H. Second silicon carbide substrate 30 has first main surface 1 and second main surface 2 opposite to first main surface 1. First main surface 1 and second main surface 2 are ground and are then subjected to mechanical polishing and CMP.

Figure 14:
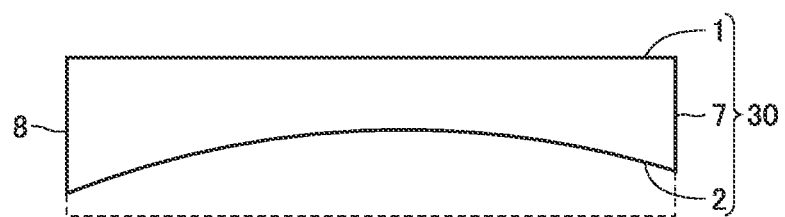
FIG. 14 is a schematic cross sectional view showing a step of forming a second silicon carbide substrate.

In the CMP step, second silicon carbide substrate 30 is attached to a polishing head (not shown). Next, second silicon carbide substrate 30 is pressed against a polishing cloth (not shown), and the polishing head and the polishing cloth are rotated in this state. A pressure at which second silicon carbide substrate 30 is pressed against the polishing cloth is adjusted in the plane of second silicon carbide substrate 30. Specifically, the in-plane pressure of second silicon carbide substrate 30 is adjusted such that pressure applied to the vicinity of the center of second silicon carbide substrate 30 becomes higher than pressure applied to the vicinity of the outer periphery of second silicon carbide substrate 30. The pressure applied to second silicon carbide substrate 30 may be adjusted using a weight. Thus, second silicon carbide substrate 30 having a different thickness in the in-plane direction is formed (see FIG. 14). As shown in FIG. 14, second main surface 2 of second silicon carbide substrate 30 may be curved to protrude toward first main surface 1. First main surface 1 is substantially flat.

The shape of second main surface 2 of second silicon carbide substrate 30 is adjusted in accordance with the shape of second silicon carbide epitaxial layer 20 shown in FIG. 13. Specifically, after second silicon carbide epitaxial layer 20 is formed on second main surface 2 of silicon carbide substrate 30, the shape of second main surface 2 of second silicon carbide substrate 30 is adjusted to attain a flat sixth main surface 6 of second silicon carbide epitaxial layer 20. That is, second main surface 2 of second silicon carbide substrate 30 is formed such that the shape of second main surface 2 of second silicon carbide substrate 30 is substantially mirror-symmetrical to the shape of sixth main surface 6 of second silicon carbide epitaxial layer 20 shown in FIG. 13 with respect to a plane parallel to second main surface 2 of first silicon carbide substrate 30.

Figure 15:
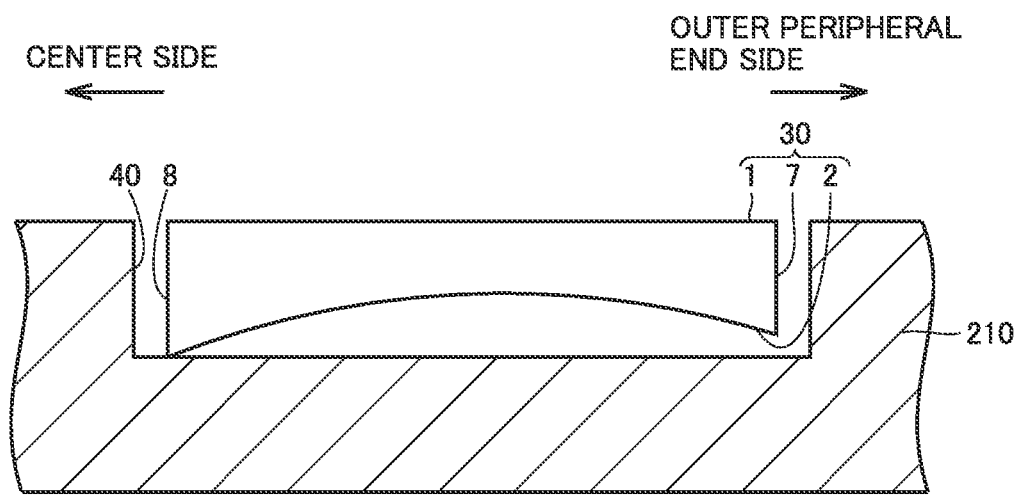
FIG. 15 is a schematic cross sectional view showing a step of placing the second silicon carbide substrate in a substrate placement groove of the susceptor.

Next, second silicon carbide substrate 30 is placed in substrate placement groove 40 of susceptor 210. As shown in FIG. 15, second silicon carbide substrate 30 is placed such that second main surface 2 of second silicon carbide substrate 30 faces the bottom surface of substrate placement groove 40. As shown in FIG. 15, orientation flat portion 7 of second silicon carbide substrate 30 is placed on the outer peripheral end side of susceptor 210. Arc-shaped portion 8 of silicon carbide substrate 30 opposite to orientation flat portion 7 is placed on the center side of susceptor 210.

Next, a second epitaxial growth step (S50: FIG. 8) is performed. Specifically, the pressure in reaction chamber 201 is decreased from the atmospheric pressure to, for example, about $1\times10^{-6}$ Pa, and then the temperature of second silicon carbide substrate 30 starts to be increased. During the increase of the temperature, hydrogen ($H_2$) gas serving as the carrier gas is introduced from fourth gas supply unit 234 into reaction chamber 201.

After the temperature of reaction chamber 201 reaches a certain temperature, the source material gas, the dopant gas, and the carrier gas are supplied to reaction chamber 201. Specifically, for example, mixed gas including silane, propane, ammonia, and hydrogen is introduced into reaction chamber 201. In reaction chamber 201, each gas is thermally decomposed. A growth temperature is, for example, more than or equal to 1550° C. and less than or equal to 1750° C.

The flow rates of silane and propane are adjusted such that the C/Si ratio of the mixed gas is, for example, about more than or equal to 0.8 and less than or equal to 2.2. The pressure in reaction chamber 201 is, for example, 6 kPa. The flow rate of the fourth gas (hydrogen gas) supplied to reaction chamber 201 may be, for example, more than or equal to 100 slm and less than or equal to 150 slm.

As shown in FIG. 2, first silicon carbide epitaxial layer 10 is formed on first main surface 1 of silicon carbide substrate 30. Similarly, second silicon carbide epitaxial layer 20 is formed on second main surface 2 of silicon carbide substrate 30. Second silicon carbide epitaxial layer 20 is formed in such a manner that a portion of a susceptor 210 composed of silicon carbide sublimates to be deposited on second main surface 2 of silicon carbide substrate 30. A larger amount of silicon carbide sublimates at a portion of susceptor 210 with a high temperature than that at a portion of susceptor 210 with a low temperature. As a result, the thickness of second silicon carbide epitaxial layer 20 at the portion of second main surface 2 in contact with the portion of susceptor 210 with the high temperature is larger than the thickness of second silicon carbide epitaxial layer 20 at the portion of second main surface 2 in contact with the portion of susceptor 210 with the low temperature.

As shown in FIG. 15, the shape of second main surface 2 of silicon carbide substrate 30 is adjusted in consideration of the thickness of second silicon carbide epitaxial layer 20 deposited on second main surface 2. Therefore, after second silicon carbide epitaxial layer 20 is formed on second main surface 2, sixth main surface 6 of second silicon carbide epitaxial layer 20 becomes substantially flat (see FIG. 2). In this way, silicon carbide epitaxial substrate 100 according to the present embodiment is manufactured.

Next, functions and effects of the present embodiment will be described.

In a step of fabricating a silicon carbide semiconductor device using silicon carbide epitaxial substrate 100, a photolithography technique is normally used. For example, when forming a pattern on a photoresist provided on silicon carbide epitaxial substrate 100, exposure is performed using a stepper. When the TTV of silicon carbide epitaxial substrate 100 is large, the exposed surface does not become flat, with the result that exposure failure is likely to occur.

When forming first silicon carbide epitaxial layer 10 on the front surface (first main surface 1) of silicon carbide substrate 30 using susceptor 210 composed of silicon carbide, silicon carbide may sublimate from susceptor 210 to be deposited on the backside surface (second main surface 2) of silicon carbide substrate 30. In this case, first silicon carbide epitaxial layer 10 is formed on first main surface 1 of silicon carbide substrate 30, and second silicon carbide epitaxial layer 20 is formed on second main surface 2. The thickness of second silicon carbide epitaxial layer 20 greatly depends on the temperature of susceptor 210.

Specifically, when the temperature of susceptor 210 is high, silicon carbide is more likely to sublimate, with the result that the thickness of second silicon carbide epitaxial layer 20 becomes large. On the other hand, when the temperature of susceptor 210 is low, silicon carbide is less likely to sublimate, with the result that the thickness of second silicon carbide epitaxial layer 20 becomes small. Therefore, when the temperature distribution of susceptor 210 in the in-plane direction is large, the thickness distribution of second silicon carbide substrate 30 in the in-plane direction is also large. In this case, even if the TTV of silicon carbide substrate 30 is small, the TTV of silicon carbide epitaxial substrate 100 after epitaxial growth becomes large. In this case, exposure failure is likely to occur.

In particular, in a region in which the temperature distribution of susceptor 210 is locally large, the thickness distribution of second silicon carbide epitaxial layer 20 of silicon carbide epitaxial substrate 100 becomes locally large. As a result, the LTV of silicon carbide epitaxial substrate 100 becomes large. In this case, exposure failure is likely to occur in a region in which the LTV is large.

Silicon carbide epitaxial substrate 100 according to the present embodiment includes silicon carbide substrate 30, first silicon carbide epitaxial layer 10, and second silicon carbide epitaxial layer 20. First silicon carbide epitaxial layer 10 is in contact with the whole of first main surface 1. Second silicon carbide epitaxial layer 20 is in contact with the whole of second main surface 2. The carrier concentration of silicon carbide substrate 30 is higher than the carrier concentration of each of first silicon carbide epitaxial layer 10 and second silicon carbide epitaxial layer 20. First silicon carbide epitaxial layer 10 has third main surface 3 in contact with first main surface 1 and fourth main surface 4 opposite to third main surface 3. The maximum diameter of fourth main surface 4 is more than or equal to 150 mm. When fourth main surface 4 is divided into the plurality of square regions 50 each having sides each having a length of 10 mm, the maximum LTV is less than or equal to 3 μm in the plurality of square regions 50. Thus, occurrence of exposure failure can be suppressed.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: first main surface; 2: second main surface; 3: third main surface; 4: fourth main surface; 5: fifth main surface; 6: sixth main surface; 7: orientation flat portion; 8: arc-shaped portion; 9: outer peripheral edge; 10: first silicon carbide epitaxial layer; 11: first maximum height point; 12: first minimum height point; 13: second minimum height point; 14: second maximum height point; 20: second silicon carbide epitaxial layer; 30: silicon carbide substrate (first silicon carbide substrate, second silicon carbide substrate); 31: first position; 32: second position; 33: third position; 34: fourth position; 35: fifth position; 36: sixth position; 37: seventh position; 38: eighth position; 40: substrate placement groove; 41: center; 42: outer peripheral end; 50: square region; 100: silicon carbide epitaxial substrate; 101: first direction; 102: second direction; 200: manufacturing apparatus; 201: reaction chamber; 202: stage; 203: heating element; 204: quartz tube; 205: inner wall surface; 207: gas inlet; 208: gas outlet; 209: rotation shaft; 210: susceptor; 231: first gas supply unit; 232: second gas supply unit; 233: third gas supply unit; 234: fourth gas supply unit; 235: gas supply unit; 241: first gas flow rate control unit; 242: second gas flow rate control unit; 243: third gas flow rate control unit; 244: fourth gas flow rate control unit; 245: control unit; A1: first temperature; A2: second temperature; A3: third temperature; H1: first thickness; H2: second thickness; L1: first plane; L2: second plane; L3: third plane; L4: fourth plane; T1: first height; T2: second height; T3: third height; T4: fourth height; W1: diameter; W2: length; TTV: total thickness variation; LTV: local thickness variation.

The invention claimed is:

1. A silicon carbide epitaxial substrate comprising:
a silicon carbide substrate having a first main surface and a second main surface opposite to the first main surface;
a first silicon carbide epitaxial layer in contact with a whole of the first main surface; and
a second silicon carbide epitaxial layer in contact with a whole of the second main surface, wherein
a carrier concentration of the silicon carbide substrate is higher than a carrier concentration of each of the first silicon carbide epitaxial layer and the second silicon carbide epitaxial layer;
wherein the silicon carbide substrate does not comprise an epitaxial layer.

2. The silicon carbide epitaxial substrate according to claim 1, wherein
the first silicon carbide epitaxial layer has a third main surface in contact with the first main surface and a fourth main surface opposite to the third main surface,
a maximum diameter of the fourth main surface is more than or equal to 150 mm, and
when the fourth main surface is divided into a plurality of square regions each having sides each having a length of 10 mm, a maximum local thickness variation of the silicon carbide epitaxial substrate is less than or equal to 3 μm in the plurality of square regions.

3. The silicon carbide epitaxial substrate according to claim 1, wherein a value obtained by dividing a standard deviation of a thickness of the first silicon carbide epitaxial layer by an average value of the thickness of the first silicon carbide epitaxial layer is smaller than a value obtained by dividing a standard deviation of a thickness of the second silicon carbide epitaxial layer by an average value of the thickness of the second silicon carbide epitaxial layer.

4. The silicon carbide epitaxial substrate according to claim 3, wherein the value obtained by dividing the standard deviation of the thickness of the first silicon carbide epitaxial layer by the average value of the thickness of the first silicon carbide epitaxial layer is less than or equal to 7%.

5. The silicon carbide epitaxial substrate according to claim 3, wherein the value obtained by dividing the standard deviation of the thickness of the second silicon carbide epitaxial layer by the average value of the thickness of the second silicon carbide epitaxial layer is more than or equal to 10%.

6. The silicon carbide epitaxial substrate according to claim 1, wherein a total thickness variation of the silicon carbide epitaxial substrate is less than or equal to 8 μm.

7. The silicon carbide epitaxial substrate according to claim 2, wherein a value obtained by dividing a standard deviation of a thickness of the first silicon carbide epitaxial layer by an average value of the thickness of the first silicon carbide epitaxial layer is smaller than a value obtained by dividing a standard deviation of a thickness of the second silicon carbide epitaxial layer by an average value of the thickness of the second silicon carbide epitaxial layer.

8. The silicon carbide epitaxial substrate according to claim 7, wherein the value obtained by dividing the standard deviation of the thickness of the first silicon carbide epitaxial layer by the average value of the thickness of the first silicon carbide epitaxial layer is less than or equal to 7%.

9. The silicon carbide epitaxial substrate according to claim 7, wherein the value obtained by dividing the standard deviation of the thickness of the second silicon carbide epitaxial layer by the average value of the thickness of the second silicon carbide epitaxial layer is more than or equal to 10%.

10. The silicon carbide epitaxial substrate according to claim 5, wherein a total thickness variation of the silicon carbide epitaxial substrate is less than or equal to 8 μm.

* * * * *